United States Patent
Sun et al.

(10) Patent No.: US 6,235,584 B1
(45) Date of Patent: May 22, 2001

(54) METHOD AND SYSTEM FOR REDUCING SHORT CHANNEL EFFECTS IN A MEMORY DEVICE

(75) Inventors: Yu Sun, Saratoga; Mark T. Ramsbey, Sunnyvale; Tommy Hsiao, Mountain View, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/412,544

(22) Filed: Oct. 5, 1999

(51) Int. Cl.[7] .................................................. H01L 21/336
(52) U.S. Cl. ........................ 438/257; 438/258; 438/264; 438/265
(58) Field of Search .................................. 438/257, 258, 438/262, 264, 265, 267, 266

(56) References Cited

U.S. PATENT DOCUMENTS 5,863,820 * 1/1999 Hung ..................................... 438/241
6,057,192 * 5/2000 Colabella ............................. 438/264

* cited by examiner

*Primary Examiner*—Carl Whitehead, Jr.
*Assistant Examiner*—Hsien-Ming Lee
(74) *Attorney, Agent, or Firm*—Sawyer Law Group LLP

(57) ABSTRACT

A method and system for providing a semiconductor memory device is disclosed. The method and system include providing a plurality of gate stacks above a substrate. Each of the plurality of gate stacks includes a first edge and a second edge. The method and system also include providing a source implant adjacent to the first edge of each of the plurality of gate stacks and driving the source implant under the first edge of each of the plurality of gate stacks. The method and system also include providing a first spacer and a second spacer for each of the plurality of gate stacks. The first and second spacers are disposed along the first and second edges, respectively, of each of the plurality of gate stacks. The method and system also include providing a drain implant after source implant is driven under the first edge and after the first and second spacers are provided. The drain implant is in the substrate adjacent to the second spacer.

13 Claims, 6 Drawing Sheets

METHOD AND SYSTEM FOR REDUCING SHORT CHANNEL EFFECTS IN A MEMORY DEVICE

FIELD OF THE INVENTION

The present invention relates to semiconductor devices, such as flash memory devices, more particularly to a method and system for reducing short channel effects in a memory device, allowing for reduced gate lengths.

BACKGROUND OF THE INVENTION

A conventional semiconductor device, such as a conventional flash memory, includes a large number of conventional memory cells in a memory region. Typically, a logic region at the periphery of the semiconductor device includes logic devices. For example, FIG. 1A depicts a side view of a portion of a conventional memory 10. The logic portion is not depicted in FIG. 1. The conventional memory 10 includes memory cells 20 and 30. The memory cells include gate stacks 25 and 35, respectively. The gate stack 25 includes a floating gate 22 and a control gate 24. The floating gate 22 and control gate 24 are typically made of polysilicon and are separated by an insulating layer 23. The floating gate is typically separated from the substrate 11 by a thin insulating film 21. Similarly, the gate stack 35 includes a floating gate 32 and a control gate 34. The floating gate 32 and control gate 34 are typically made of polysilicon and are separated by an insulating layer 33. The floating gate is typically separated from the substrate 11 by a thin insulating film 31. Spacers 26 and 28 and 36 and 38 are provided at the edges of the gate stacks 25 and 35, respectively. The memory cells 20 and 30 also share a common source 12. The memory cell 20 includes a drain 14, while the memory cell 30 includes a drain 16. The source 12 typically includes two implants, a first, double diffused implant ("DDI") and a second, moderately doped drain implant ("MDDI") implant. The drain typically includes only an MDDI implant. Between the source 12 and drains 14 and 16 are channel regions 27 and 37, respectively.

FIG. 1B depicts a plan view of the conventional memory 10. The top, control gates 24 and 34 are thus depicted. The floating gates 22 and 32, insulating layers 21 and 31 and insulating layers 23 and 33 lie below the control gates 24 and 34. The source 12 and drains 14 and 16 of the memory cells 20 and 30 are also depicted. In addition, the drains 14', 14", 16' and 16" and shared sources 12' and 12" of four other memory cells (not separately numbered) are also shown. Therefore, as can be seen in FIG. 1B, the gate stacks 20 and 30 may include multiple memory cells.

Also shown in FIG. 1B are field oxide regions 42, 44, 46, 48, 50 and 52. The field oxide regions 42, 44, 46, 48, 50 and 52 electrically insulate portions of the memory cells of the conventional memory 10. For example, the field oxide regions 42 and 48 separate drain 14 from drains 14' and 14". Similarly, the field oxide regions 46 and 52 separate drain 16 from drains 16' and 16". Although only the field oxide regions 42, 44, 46, 48, 50 and 52 that are uncovered are shown, field oxide typically exists under the control gates 24 and 34. As grown, the field oxide regions 42, 44 and 46 are connected beneath the control gates 24 and 34, forming a single continuous field oxide region. Similarly, the field oxide regions 48, 50 and 52 are connected beneath control gates 24 and 34. Furthermore, although field oxide regions 44 and 50 are shown, these field oxide regions may be removed during fabrication to allow the sources 12, 12' and 12" to be electrically connected. Alternate conventional methods electrically isolate the memory cells using trenches or buried bit lines. Consequently, any structure which isolates memory cells will be termed a field isolation region.

FIG. 2A depicts one conventional method 60 for providing the conventional memory 10. The gate stacks 25 and 35 which cross the field isolation regions 42, 44, 46, 48, 50, and 52 are provided, via step 62. The source and drain implants are then provided, via step 64. Typically the source implant includes a MDDI implant and a DDI implant, while the drain implant includes an MDDI implant. Typically, the DDI implant includes P at a concentration of approximately $1 \times 10^{13} – 5 \times 10^{14}$ atoms/cm$^2$ and As at a concentration of approximately $5 \times 10^{14} – 8 \times 10^{15}$ atoms/cm$^2$. For the DDI implant, the P or As are implanted at an energy of approximately twenty to one hundred kilo electron volts. The MDDI implant typically includes As at a concentration of approximately $5 \times 10^{14} – 8 \times 10^{15}$ atoms/cm$^2$. The drain implant also typically includes As at a concentration of approximately $5 \times 10^{14} – 8 \times 10^{15}$ atoms/cm$^2$.

A portion of each of the sources 12, 12' and 12" is desired to be under the gate to facilitate erasing through the source 12, 12' or 12". Thus, once the dopants are implanted in step 64, an anneal or oxidation is performed to drive the source dopants under the gates 22 and 32, via step 66. The sources 12, 12' and 12" extend under the edges of the gate stacks 25 and 35 because of step 66. The spacers 26, 28, 36 and 38 are then provided, via step 68. Step 68 typically includes depositing insulating layers and etching the layers to form the spacers. Thus, the memory cells 20 and 30 are completed.

FIG. 2B depicts a second conventional method 70 for providing the conventional memory 10. The gate stacks 25 and 35 which cross the field isolation regions 42, 44, 46, 48, 50, and 52 are provided, via step 72. The first source implant and the drain implant are then provided, via step 74. Typically the first source implant includes a MDDI implant and a DDI implant, while the drain implant includes an MDDI implant. Typically, the DDI implant includes P at a concentration of approximately $1 \times 10^{13} – 5 \times 10^{14}$ atoms/cm$^2$ and As at a concentration of approximately $5 \times 10^{14} – 8 \times 10^{15}$ atoms/cm$^2$. For the DDI implant, the P or As are implanted at an energy of approximately twenty to one hundred kilo electron volts. The drain implant typically includes As at a concentration of approximately $5 \times 10^{14} – 8 \times 10^{15}$ atoms/cm$^2$.

A portion of each of the sources 12, 12' and 12" is desired to be under the gate to facilitate erasure through the source 12, 12' or 12". Thus, once the dopants are implanted in step 74, an anneal or oxidation is performed to drive the dopants in the first source implant under the gates 22 and 32, via step 76. The sources 12, 12' and 12" extend under the edges of the gate stacks 25 and 35 because of step 76. The spacers 26, 28, 36 and 38 are then provided, via step 78. Step 78 typically includes depositing insulating layers and etching the layers to form the spacers. A self-aligned source ("SAS") etch is performed, via step 80. The SAS etch removes the field isolation regions 44 and 50 so that the source 12, 12' and 12" can be electrically coupled using another implant. In one version of the conventional method 70, the spacers are provided in step 78 before the SAS etch is performed in step 80. Such an order protects the edge of the gate stacks 25 and 35 from damage during the SAS etch performed in step 80. Once the SAS etch is performed, a second source implant and a source connection implant are provided, via step 82. The second source implant typically includes As.

Although the conventional memory 10 functions, one of ordinary skill in the art will readily recognize that as the memory cells 20 and 30 shrink in size, the memory cells 20 and 30 may suffer from short channel effects. It is desirable to decrease the size of conventional memory cells 20 and 30 in order to increase the density of memory cells 20 and 30 in the conventional memory 10. This may be accomplished by decreasing the length of the floating gates 22 and 32 and, therefore, the length of the gate stacks 25 and 35. However, as the lengths of the gate stacks 25 and 35 decrease, the length of the channels 27 and 37 decrease. As the source 12 and drain 14 of a conventional memory cell 20 become closer, short channel effects adversely affect the behavior of the memory cell 20. For example, short channel effects may cause the threshold voltage of the memory cell 20 or 30 to drop below a desired level, preventing the memory cell 20 or 30 from functioning reliably.

Furthermore, the conventional memory cells 20 and 30 also have shorter channels 27 and 37, respectively, than desired. Referring to FIGS. 1A, 2A and 2B, because of the anneal steps 66 and 76, the source 12 is driven under the gate 22 and 32. This is desired because the source 12 is used to erase the memory cells 20 and 30. The drains 14 and 16, however, are used in programming the memory cell. The drains 14 and 16 need not be driven as far under the gate 22 and 32, respectively. Furthermore, sharp drain junctions 14 and 16 are desirable for programming. However, the drains implants are also driven by the anneal steps 66 and 76. Therefore, as depicted in FIG. 1A, the implants for the drains 14 and 16 are driven under the gates 22 and 32. As a result, the channels 27 and 37 are further reduced in size. Thus, the memory cells 20 and 30 are more subject to short channel effects, especially at higher densities and small gate lengths.

Accordingly, what is needed is a system and method for providing the semiconductor device in which the short channel effects for a memory cell of a given size are reduced. The present invention addresses such a need.

SUMMARY OF THE INVENTION

The present invention provides a method and system for providing a semiconductor memory device. The method and system comprise providing a plurality of gate stacks above a substrate. Each of the plurality of gate stacks includes a first edge and a second edge. The method and system also comprise providing a source implant adjacent to the first edge of each of the plurality of gate stacks and driving the source implant under the first edge of each of the plurality of gate stacks. The method and system also comprise providing a first spacer and a second spacer for each of the plurality of gate stacks. The first and second spacers are disposed along the first and second edges, respectively, of each of the plurality of gate stacks. The method and system also comprise providing a drain implant after first source implant is driven under the first edge and after the first and second spacers are provided. The drain implant is in the substrate adjacent to the second spacer.

According to the system and method disclosed herein, the present invention allows the drain implant to be spaced farther from the center of the gate stack while the source implant is driven under the gate stack. Consequently, memory cells have the desired properties with reduced short channel effects. The length of the gates can thus be reduced, allowing for more memory cells to be fit in a given area.

DETAILED DESCRIPTION OF THE INVENTION

Figure 1A:
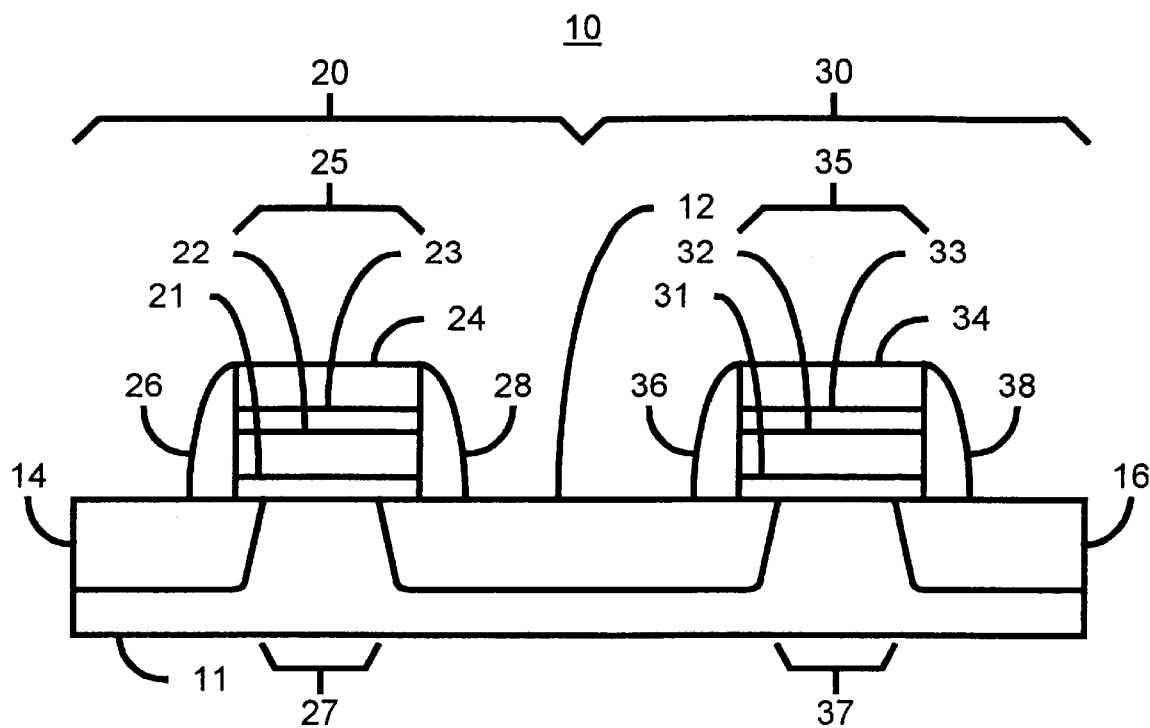
FIG. 1A is a diagram depicting a side view of a portion of a conventional semiconductor memory device.
Figure 1B:
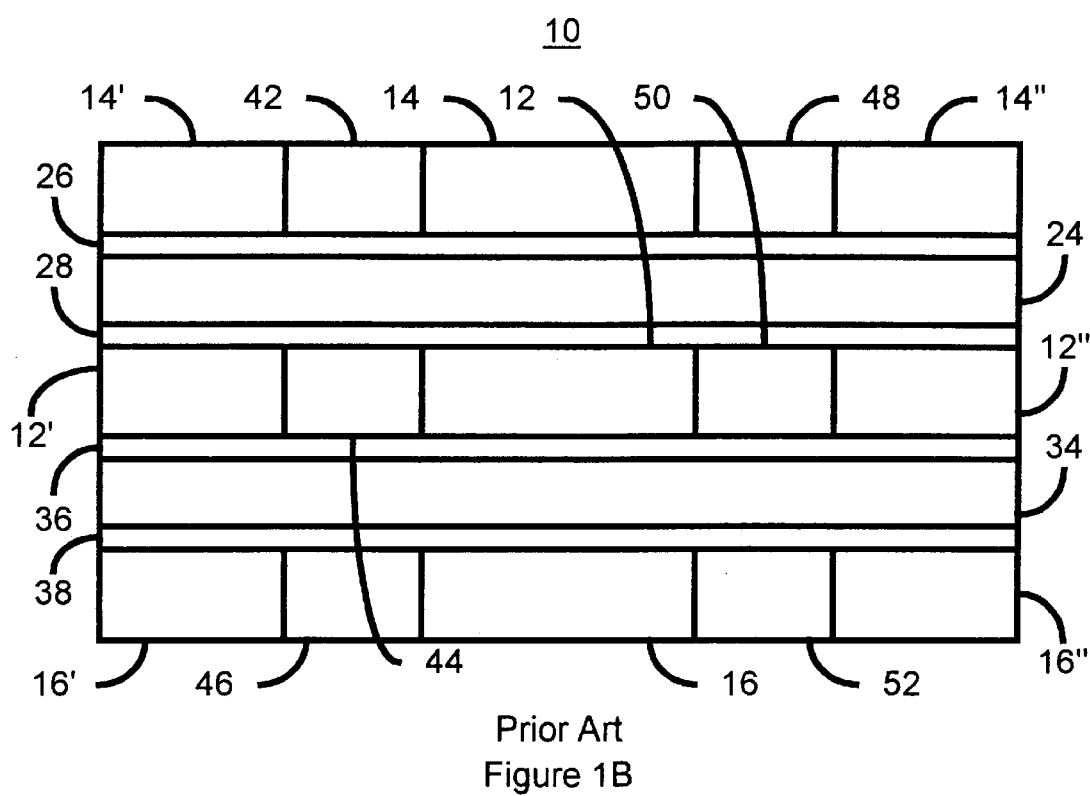
FIG. 1B is a diagram of a plan view of the conventional semiconductor memory device.

The present invention relates to an improvement in semiconductor processing. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The current trend in semiconductor memory devices is toward higher densities and, therefore, smaller memory cell sizes. A conventional memory cell typically includes a gate stack having a floating gate and a control gate, a source, a drain and a channel between the source and the drain. In addition, spacers may be provided at the edges of the gate stack. In order to make conventional memory cells smaller, the length of the floating gate may be decreased. However, this causes a decrease in the length of the channel. As a result, the conventional memory cell may be subject to short channel effects, which adversely affect operation of the conventional memory cell. Furthermore, conventional processes for fabricating conventional memory cells typically drive the source and drain implants under the floating gate. The source implant is desired to be driven under the floating gate in order to facilitate erasing of the conventional memory cell. However, sharp drain junctions are desirable for programming. Driving the drain implant further under the gate further shortens the channel of the conventional memory cell. Consequently, the conventional memory cell may be further subject to short channel effects.

The present invention provides a method and system for providing a semiconductor memory device. The method and system comprise providing a plurality of gate stacks above a substrate. Each of the plurality of gate stacks includes a first edge and a second edge. The method and system also comprise providing a source implant adjacent to the first edge of each of the plurality of gate stacks and driving the source implant under the first edge of each of the plurality of gate stacks. The method and system also comprise providing a first spacer and a second spacer for each of the plurality of gate stacks. The first and second spacers are disposed along the first and second edges, respectively, of each of the plurality of gate stacks. The method and system also comprise providing a drain implant after source implant is driven under the first edge and after the first and second spacers are provided. The and drain implant is in the substrate adjacent to the respectively the second spacer, respectively.

The present invention will be described in terms of a particular device having certain components and particular techniques for performing certain steps. However, one of ordinary skill in the art will readily recognize that this method and system will operate effectively for other devices having other components and fabricated using other techniques. For example, other species could be used for the implant. Similarly, processes which do or do not use a self-aligned source technique are consistent with the present invention. Furthermore, the present invention will be described in terms of a particular semiconductor memory device. However, nothing prevents the method and system from being utilized with another semiconductor device.

Figure 3:
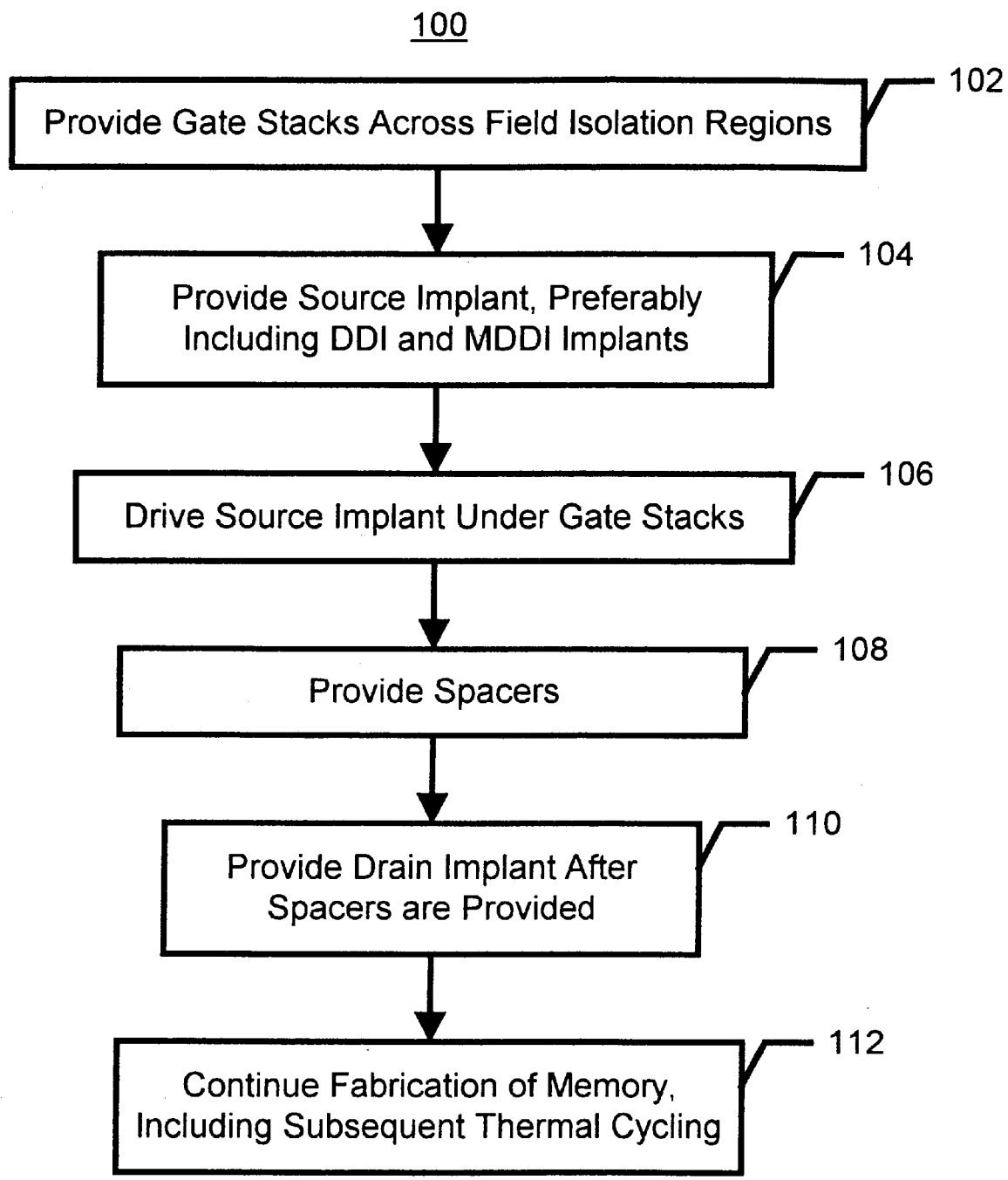
FIG. 3 is a flow chart depicting one embodiment of a method for providing a portion of a semiconductor memory device layer in accordance with the present invention.

To more particularly illustrate the method and system in accordance with the present invention, refer now to FIG. 3 depicting one embodiment of a method 100 for providing a semiconductor memory device, such as a flash memory, in accordance with the present invention. Gate stacks are provided, via step 102. Generally, the gate stack includes a floating gate separated from an underlying substrate by a thin insulating layer, a control gate, and an insulating layer which separates the control gate from the floating gate. Preferably, the floating gate and control gate are provided by providing polysilicon lines which are substantially perpendicular to the field isolation regions. The gate stacks also generally cross field isolation regions. The field isolation regions are preferably perpendicular to the gate stacks.

Once the gate stacks have been provided, a source implant is provided, via step 104. In one embodiment, the source implant includes a first implant and a second implant. The first implant is a double diffused ("DDI") implant, while the second implant is an MDDI implant. The DDI implant preferably includes P at a concentration of approximately $1\times10^{13}$–$5\times10^{14}$ atoms/cm$^2$ and As at a concentration of approximately $5\times10^{14}$–$8\times10^{15}$ atoms/cm$^2$. For the DDI implant, the P or As are implanted at an energy of approximately twenty to one hundred kilo electron volts. The MDDI implant is preferably As at a concentration of $5\times10^{14}$–$8\times10^{15}$ atoms/cm$^2$.

The source implant is driven under the edge of the gate stacks, via step 106. Preferably, step 106 is accomplished by annealing the source implant or oxidizing the source implant. Thus, in one embodiment, the DDI implant and the MDDI implant are thermally cycled in step 106.

The spacers are provided, via step 108. Step 108 typically includes depositing insulating layers and etching the layers to form the spacers. In a one embodiment, step 108 forms both the spacers in the core, memory region of the memory device and spacers for logic devices at the peripheral, logic portion of the memory device. The spacers may be of a range of thicknesses and materials. For example, oxide spacers may be used. In one embodiment, the oxide spacers between 1400 and 2000 Angstroms and are preferably approximately 1700 Angstroms. Nitride spacers might also be used. In one embodiment, the nitride spacers are between two hundred and three hundred Angstroms in thickness.

Figure 2A:
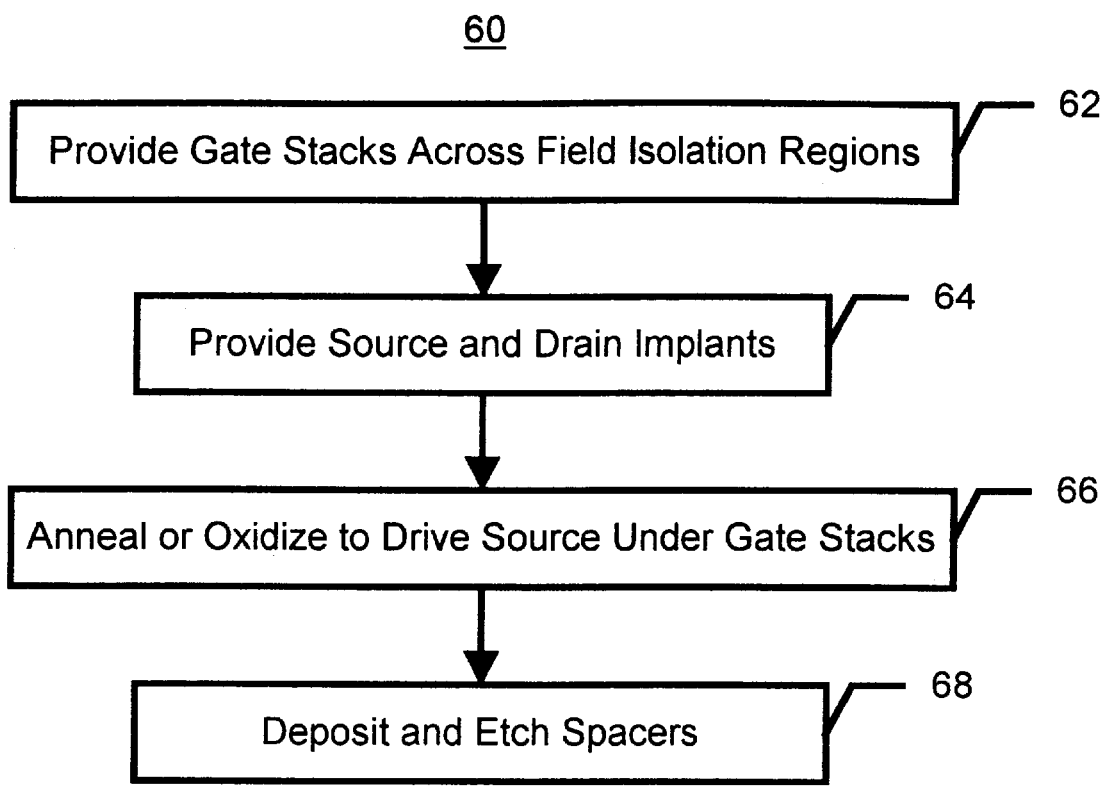
FIG. 2A is a flow chart of one conventional method for providing conventional semiconductor memory device.
Figure 2B:
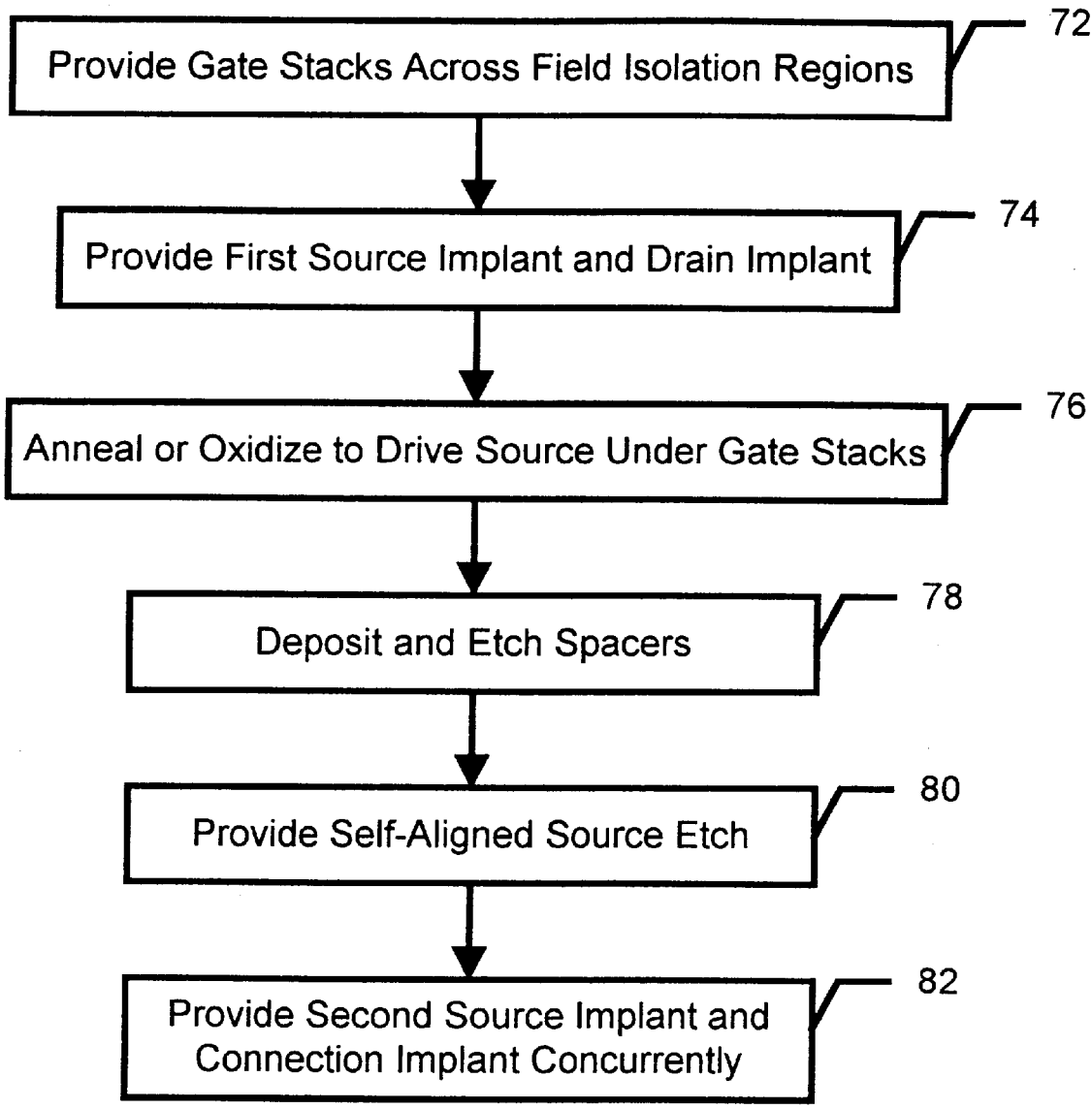
FIG. 2B is a flow chart of a second conventional method for providing conventional semiconductor memory device.

A drain implant is performed after the spacers have been provided, via step 110. Thus, the drain implant is performed after the spacer deposition and etch in step 108. The drain implant is also performed after the driving step 106. Preferably, the drain implant is a MDDI implant. The drain implant provided in step 110 may include As at a concentration of approximately $5\times10^{14}$–$8\times10^{15}$ atoms/cm$^2$. Additional processing, including thermal cycling may then be provided to complete fabrication of the memory, via step 112. Part of the processing performed in step 112 may include etching portions of the field isolation regions between sources, for example in a self-aligned source ("SAS") etch, and providing a separate implant to connect the sources of the memory cells. Similarly, the SAS and other steps might be performed at another point in the method 100, including earlier in the method 100. The subsequent thermal cycling that may be performed in step 112 may include a rapid thermal anneal to repair damage to the memory device incurred during processing. The subsequent thermal cycling preferably drives the drain implant to the edge of the gate stacks, but not under the gate stacks. However, even if subsequent thermal cycling drives the drain implant under the gate stack, the drain implant is not subject to the driving step 106. Consequently, the drain implant will not be driven as far under the gate stack than in the conventional methods 60 or 70 (FIGS. 2A and 2B). Thus, for a given gate length, the channel will be longer for memory cells of a memory device fabricated in accordance with the method 100. Consequently, short channel effects are mitigated, allowing the gate length to be reduced while achieving the same performance. A memory device fabricated using the method 100 can, therefore, have a higher density of memory cells.

Figure 4:
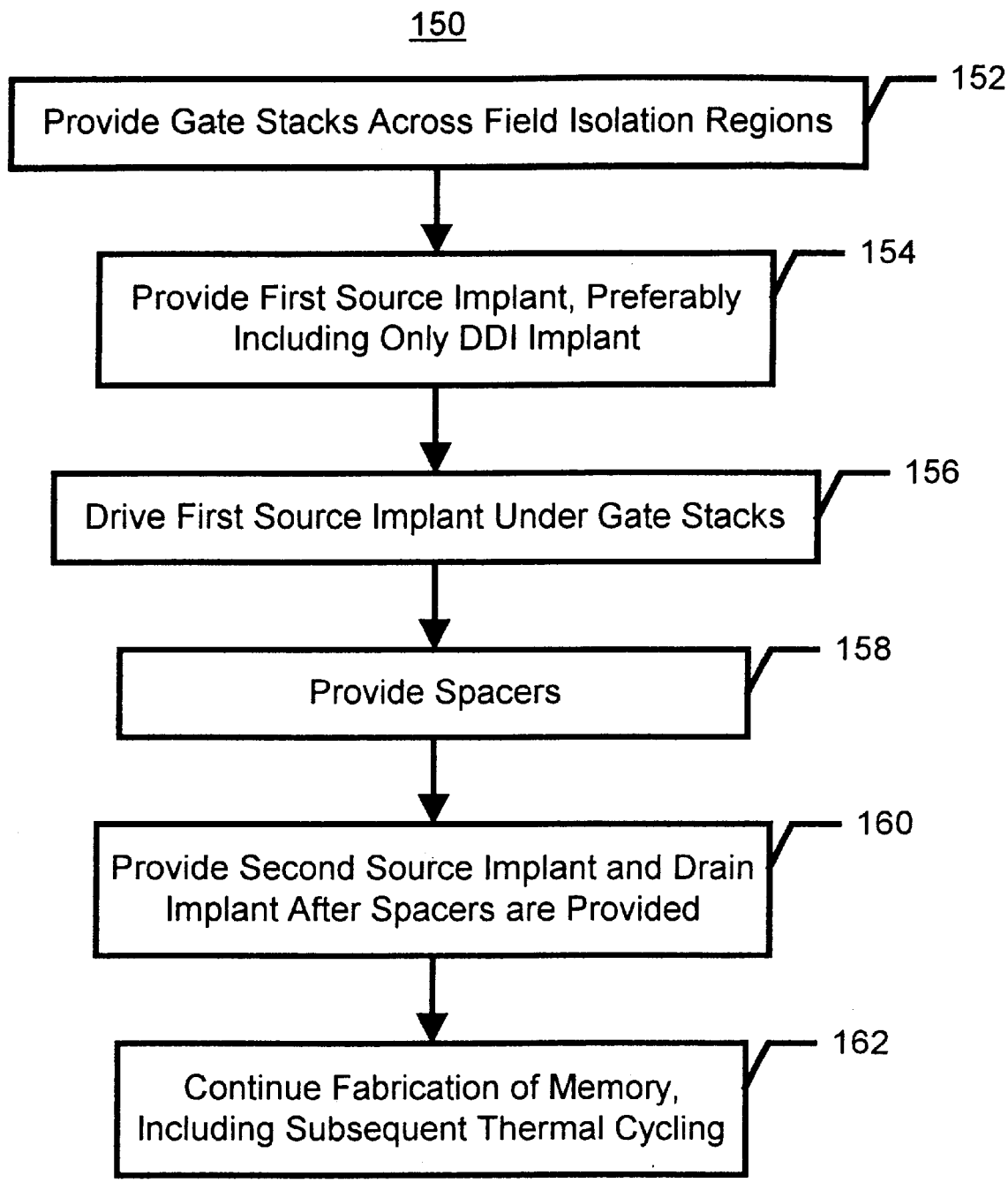
FIG. 4 is a flow chart depicting another embodiment of a method for providing a portion of a semiconductor device in accordance with the present invention.

FIG. 4 depicts another embodiment of a method 150 for providing a memory device in accordance with the present invention. Gate stacks, which may cross field isolation regions, are provided, via step 152. Preferably, the floating gate and control gate are provided by providing polysilicon lines which are substantially perpendicular to the field isolation regions. A first source implant is then provided, via step 154. Preferably, the first source implant includes only the DDI implant of As and P at the concentrations and energies discussed above. The first source implant is driven under the edge of the gate stacks, via step 156. Step 156 is preferably accomplished by annealing the first source implant or oxidizing the first source implant.

The spacers are provided, via step 158. Step 158 generally includes depositing insulating layers and etching the layers to form the spacers. In one embodiment, step 158 forms both the spacers in the core, memory region of the memory device and spacers for logic devices at the peripheral, logic portion of the memory device. Thus, the spacers provided in step 158 are analogous to the spacers provided in step 108 of the method 100 depicted in FIG. 3.

Referring back to FIG. 4, a second source implant and a drain implant are performed, via step 160. These implants are performed after the spacer deposition and etch in step 158. Preferably, the second source and drain implants are MDDI As implants at the concentrations and energies discussed with respect to the method 100 depicted in FIG. 3. Referring back to FIG. 4, additional processing, including thermal cycling may then be provided to complete fabrication of the memory, via step 162. Part of the processing performed in step 162 may include etching portions of the field isolation regions between sources, for example performing a SAS etch, and providing a separate implant to connect the sources of the memory cells. Similarly, the SAS and other steps might be performed at another point in the method 150, including earlier in the method 150. The subsequent thermal cycling that may be performed in step 162 may include a rapid thermal anneal to repair damage to the memory device incurred during processing. The subsequent thermal cycling preferably drives the drain implant to the edge of the gate stacks, but not under the gate stacks. However, even if subsequent thermal cycling drives the drain implant under the gate stack, the drain implant is not subject to the driving step 156. Consequently, the drain implant will not be driven as far under the gate stack than in the conventional methods 60 or 70 (FIGS. 2A and 2B). Thus, for a given gate length, the channel will be longer for memory cells of a memory device fabricated in accordance with the method 150. Consequently, short channel effects are mitigated, allowing the gate length to be reduced while achieving the same performance. A memory device fabricated using the method 150 can, therefore, have a higher density of memory cells.

Figure 5:
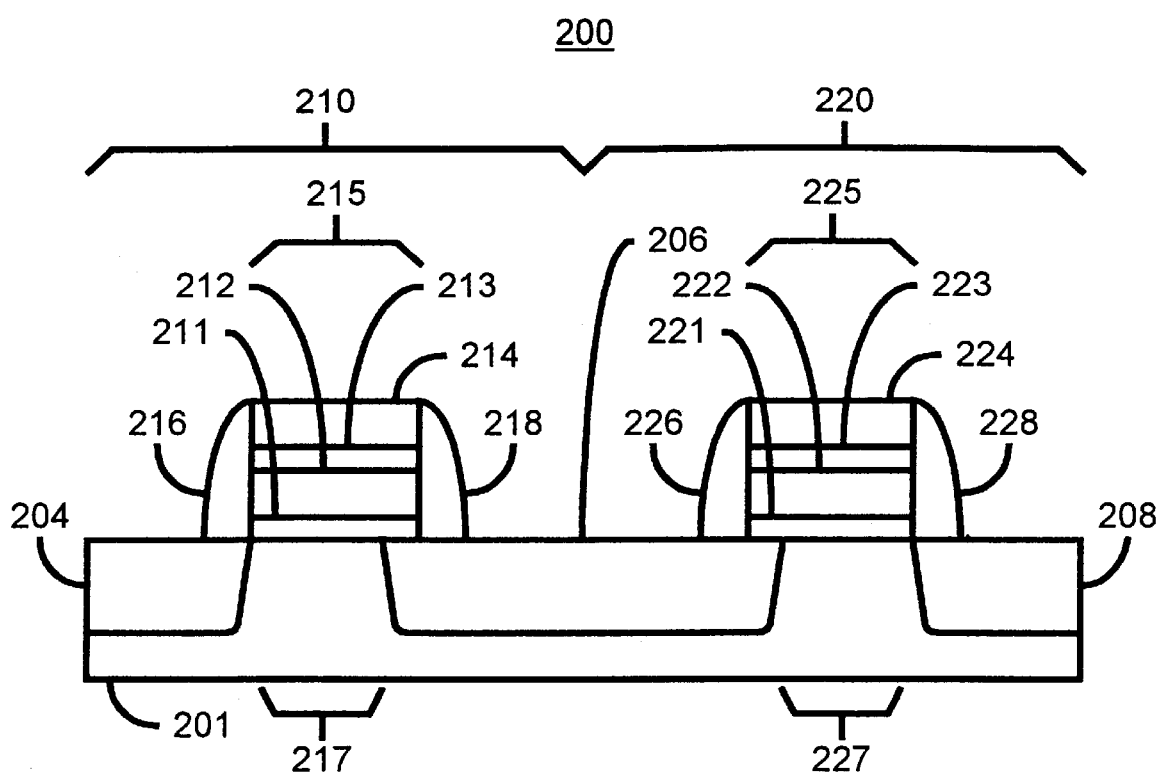
FIG. 5 is a diagram depicting a side view of a portion of a semiconductor memory device in accordance with the present invention.

FIG. 5 depicts a side view of a portion of a memory device 200, such as a flash memory, fabricated in accordance with the method 100 or 150. Note that a logic portion, which may be part of the memory device 200, is not depicted in FIG. 5. The memory 200 includes memory cells 210 and 220. The memory cells include gate stacks 215 and 225, respectively. The gate stack 215 includes a floating gate 212 and a control gate 214. The floating gate 212 and control gate 214 are typically made of polysilicon and are separated by an insulating layer 213. The floating gate is typically separated from the substrate 201 by a thin insulating film 211. Similarly, the gate stack 225 includes a floating gate 222 and a control gate 224. The floating gate 222 and control gate 224 are typically made of polysilicon and are separated by an insulating layer 223. The floating gate is typically separated from the substrate 201 by a thin insulating film 221. Spacers 216 and 218 and spacers 226 and 228 are provided at the edges of the gate stacks 215 and 225, respectively. The memory cells 210 and 220 also share a common source 206. The memory cell 210 includes a drain 204, while the memory cell 220 includes a drain 208. Between the source 206 and drains 204 and 208 are channel regions 217 and 227, respectively.

Because the drain implant provided in step 110 or 160 is subject to less thermal cycling, the drains 204 and 208 extend only up to approximately the edges of gate stacks 215 and 225. However, the source implant performed in step 104 or 154 was driven under the gate stacks 215 and 225 in step 106 or 156, respectively. The source 206, therefore, extends under the gate stacks 215 and 225 as desired. Consequently, erasure using the source 206 is possible. The memory cells 210 and 220 can also be programmed using the drains 204 and 208, respectively. Because the drains 204 and 208 do not extend as far under the gate stacks 215 and 225 as in the conventional memory cell, the channels 217 and 227 are longer for a given length of the floating gates 212 and 222. Thus, a memory cell 210 or 220 of a given size is less subject to short channel effects. Consequently, shorter gate lengths can be used without adversely affecting performance of the memory cells 210 and 220. Thus, the method 100 or 150 can provide a memory device 200 having shorter gate lengths and memory cells 210 and 220 which are more densely packed.

A method and system has been disclosed for providing a memory device having reduced short channel effects. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing a semiconductor memory device including a substrate and at least one field isolation region, the method comprising the steps of:

(a) providing a plurality of gate stacks above the substrate, each of the plurality of gate stacks including a first edge and a second edge, each of the plurality of gate stacks crossing the at least one field isolation region;

(b) providing at least one source implant adjacent to the first edge of each of the plurality of gate stacks for a source for each of the plurality of gate stacks;

(c) driving the at least one source implant under the first edge of each of the plurality of gate stacks;

(d) providing a first spacer and a second spacer for each of the plurality of gate stacks after formation of the source is completed, the first spacer being disposed along the first edge of each of the plurality of gate stacks, the second spacer being disposed along the second edge of each of the plurality of gate stacks; and (e) providing at least one drain implant for a drain after the driving step (c) and after the spacer providing step (d), the drain implant being provided in the substrate adjacent to the second spacer, and the formation of the drain being commenced after completion of the source.

2. The method of claim 1 wherein source implant providing step (b) further includes the step of:

(b1) providing a first source implant and a second source implant adjacent to the first edge of each of the plurality of gate stacks; and wherein driving step (c) further includes the steps of:

(c1) driving the first source implant and the second source implant under the first edge of each of the plurality of gate stacks.

3. The method of claim 1 wherein the semiconductor memory device further includes a periphery including a plurality of logic devices and wherein the spacer providing step (d) further includes the step of:

(d1) providing the first spacer and the second spacer concurrently with a plurality of spacers in the periphery of the semiconductor memory device.

4. The method of claim 1 wherein the drain implant is As.

5. The method of claim 4 wherein the second source implant is As.

6. The method of claim 1 further comprising the step of:

(f) driving the drain implant to the second edge of each of the plurality of gate stacks by thermal cycling.

7. The method of claim 1 further comprising the step of:

(f) providing a rapid thermal anneal after the drain implant has been provided.

8. A semiconductor memory device including a substrate, the semiconductor device comprising:

a plurality of gate stacks above the substrate, each of the plurality of gate stacks having a first edge and a second edge;

a first spacer and a second spacer for each of the plurality of gate stacks, the first spacer being disposed along the first edge of each of the plurality of gate stacks, the second spacer being disposed along the second edge of each of the plurality of gate stacks;

at least one source for each of the plurality of gate stacks, each of the at least one source including a source implant, the source implant being provided in the substrate adjacent to the first edge of each of the plurality of gate stacks and driven under the first edge of each of the plurality of gate stacks, each of the at least one sources being completed prior to the first spacer and second spacer being provided; and at least one drain for each of the plurality of gate stacks, the at least one drain including a drain implant, the drain implant being provided in the substrate adjacent to the second spacer, the drain implant being provided after the first spacer and second spacer are provided and after the source is completed, wherein the source is driven farther under the gate stack than the drain.

9. The semiconductor device of claim 8 wherein the at least one source includes the first source implant and a second source implant, the first source implant and second source implant being provided in the substrate adjacent to the first edge of each of the plurality of gate stacks and driven under the first edge of each of the plurality of gate stacks prior to the first spacer and second spacer being provided.

10. The semiconductor memory device of claim 8 further including a periphery including a plurality of logic devices and wherein the first spacer and the second spacer are provided concurrently with a plurality of spacers in the periphery of the semiconductor memory device.

11. The semiconductor memory device of claim 8 wherein the drain implant is As.

12. The semiconductor memory device of claim 11 wherein the second source implant is As.

13. The semiconductor memory device of claim 8 wherein the drain implant is driven to the second edge of each of the plurality of gate stacks.

\* \* \* \* \*